United States Patent
Inoue

(10) Patent No.: US 8,379,390 B2
(45) Date of Patent: Feb. 19, 2013

(54) PACKAGE SUBSTRATE

(75) Inventor: Yoshihiko Inoue, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 140 days.

(21) Appl. No.: 12/869,843

(22) Filed: Aug. 27, 2010

(65) Prior Publication Data

US 2011/0096505 A1   Apr. 28, 2011

(30) Foreign Application Priority Data

Aug. 31, 2009   (JP) .................................. 2009-200228

(51) Int. Cl.
*H05K 7/20*   (2006.01)

(52) U.S. Cl. ........ 361/713; 361/688; 361/715; 361/719; 361/753; 174/383; 257/726

(58) Field of Classification Search .......... 361/688–690, 361/701–704, 707, 709–722, 748, 752–753, 361/760, 799, 812, 816
See application file for complete search history.

(56) References Cited

U.S. PATENT DOCUMENTS

| | | | |
|---|---|---|---|
| 5,550,713 A * | 8/1996 | Pressler et al. ................ | 361/818 |
| 5,982,621 A | 11/1999 | Li | |
| 6,430,043 B1 * | 8/2002 | Osburn .................... | 361/679.54 |
| 6,624,432 B1 * | 9/2003 | Gabower et al. ........... | 250/515.1 |
| 6,673,998 B1 * | 1/2004 | Wu ................. | 174/383 |
| 7,262,369 B1 * | 8/2007 | English ......... | 174/370 |
| 8,059,416 B2 * | 11/2011 | Li et al. ........ | 361/752 |
| 8,081,476 B2 * | 12/2011 | Tsao et al. ....... | 361/719 |
| 8,130,499 B2 * | 3/2012 | Ohnishi et al. ........ | 361/710 |
| 2003/0193794 A1 | 10/2003 | Reis et al. | |
| 2006/0139887 A1 * | 6/2006 | Kameda ......... | 361/704 |
| 2007/0045819 A1 | 3/2007 | Edwards et al. | |
| 2007/0086170 A1 * | 4/2007 | Liang ............... | 361/719 |
| 2007/0090502 A1 | 4/2007 | Zhao et al. | |
| 2010/0020497 A1 * | 1/2010 | Hayakawa et al. ....... | 361/705 |
| 2010/0157544 A1 * | 6/2010 | Tsao et al. ....... | 361/720 |

FOREIGN PATENT DOCUMENTS

| | | |
|---|---|---|
| EP | 1 347 513 A2 | 9/2003 |
| JP | 2002-141688 A | 5/2002 |
| JP | 2002-289753 A | 10/2002 |
| JP | 2003-298283 A | 10/2003 |

OTHER PUBLICATIONS

European Search Report of corresponding EP Application No. 10 17 4593.3 dated Dec. 14, 2010.

* cited by examiner

*Primary Examiner* — Courtney Smith
(74) *Attorney, Agent, or Firm* — Global IP Counselors

(57) ABSTRACT

A package substrate includes a circuit board, an electronic component, an electromagnetic shield cover, and a heat conducting member. The electronic component is disposed on the circuit board. The electromagnetic shield cover is fixedly coupled to the circuit board. The electromagnetic shield cover houses the electronic component within an inside space defined between the electromagnetic shield cover and the circuit board. The heat conducting member is disposed between the electronic component and the electromagnetic shield cover within the inside space. The heat conducting member contacts both of the electronic component and the electromagnetic shield cover such that the heat conducting member establishes a thermal connection between the electronic component and the electromagnetic shield cover.

13 Claims, 4 Drawing Sheets

PACKAGE SUBSTRATE

CROSS-REFERENCE TO RELATED APPLICATIONS

This application claims priority to Japanese Patent Application No. 2009-200228 filed on Aug. 31, 2009. The entire disclosure of Japanese Patent Application No. 2009-200228 is hereby incorporated herein by reference.

BACKGROUND

1. Field of the Invention

The present invention generally relates to a package substrate. More specifically, the present invention relates to a package substrate having an electromagnetic shield cover.

2. Background Information

A conventional package substrate includes a circuit board, an electronic part and an electromagnetic shield plate. The electronic part includes an IC (Integrated Circuit). The electronic part and other electronic circuits are disposed on the circuit board that has a specific shape, such as a rectangular shape. An entire board surface of the circuit board is covered by the electromagnetic shield plate. The electromagnetic shield plate is made of sheet metal. The electromagnetic shield plate is attached to the circuit board.

With this type of package substrate, the electromagnetic shield plate is given a function of blocking unnecessary radiation noise emitted from the electronic part or some other electronic circuits. This function is realized by covering the entire periphery of the electronic part or other electronic circuits with the electromagnetic shield plate in a non-contact state. On the other hand, with this package substrate, since the electronic part is located in a space surrounded by the circuit board and the electromagnetic shield plate, any heat emitted from the electronic part is trapped in the space, which diminishes a heat radiating effect. As a result, the electronic part emits so much heat that a specific temperature limit is exceeded.

One way to suppress the heat generation of the electronic part is to place the electronic part over a sheet metal heat radiating plate erected on the circuit board. With this configuration, the heat generated by the electronic part is conducted to the heat radiating plate and is radiated from the heat radiating plate. However, the heat radiating plate attached in a vertical orientation to the circuit board sticks up rather high from the board surface of the circuit board. Accordingly, placing the electronic part over the heat radiating plate that is in the vertical orientation cannot be employed when a thinner electrical or electronic device is required.

Meanwhile, with the package substrate, spacing between the circuit board and a flat roof of the electromagnetic shield plate is kept as narrow as possible, making it relatively easy to reduce thickness of the package substrate. In view of this, one idea is to utilizing the electromagnetic shield plate as a heat radiating plate for suppressing heat generation from the electronic part mounted on the circuit board, without sacrificing the reduction in the thickness of the package substrate.

Specifically, there have been conventional configurations for utilizing an electromagnetic shield plate not only to block unnecessary radiation noise, but also as a heat radiating plate (see, Japanese Laid-Open Patent Publication Nos. 2002-289753, 2003-298283 and 2002-141688). These employ a configuration in which an electromagnetic shield plate attached to a circuit board is placed directly over an electronic part mounted on the circuit board. The electronic part is sandwiched between the circuit board and the electromagnetic shield plate. With these configurations, the electromagnetic shield plate serving as a heat radiating plate does not stick up high from the circuit board, and heat generated by the electronic part is transmitted to the electromagnetic shield plate and then diffused from the electromagnetic shield plate.

SUMMARY

It has been discovered that, with these configurations, since the electromagnetic shield plate is directly disposed on the electronic part, unnecessary radiation noise emitted from the electronic part is transmitted to and released from the electromagnetic shield plate. As a result, it is difficult for the electromagnetic shield plate to adequately block the unnecessary radiation noise.

An improved package substrate was conceived in light of the above-mentioned problem. One object of the present disclosure is to provide a package substrate with which heat radiation and electromagnetic shielding of the package substrate are improved.

In accordance with one aspect of the present disclosure, a package substrate includes a circuit board, an electronic component, an electromagnetic shield cover, and a heat conducting member. The electronic component is disposed on the circuit board. The electromagnetic shield cover is fixedly coupled to the circuit board. The electromagnetic shield cover houses the electronic component within an inside space defined between the electromagnetic shield cover and the circuit board. The heat conducting member is disposed between the electronic component and the electromagnetic shield cover within the inside space. The heat conducting member contacts both of the electronic component and the electromagnetic shield cover such that the heat conducting member establishes a thermal connection between the electronic component and the electromagnetic shield cover.

With this package substrate, it is possible to provide a package substrate with which heat radiation and electromagnetic shielding of the package substrate are improved.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from these disclosures that the following descriptions of the selected embodiments are provided for illustration only and not for the purpose of limiting the invention as defined by the appended claims and their equivalents.

First Embodiment

Figure 1:
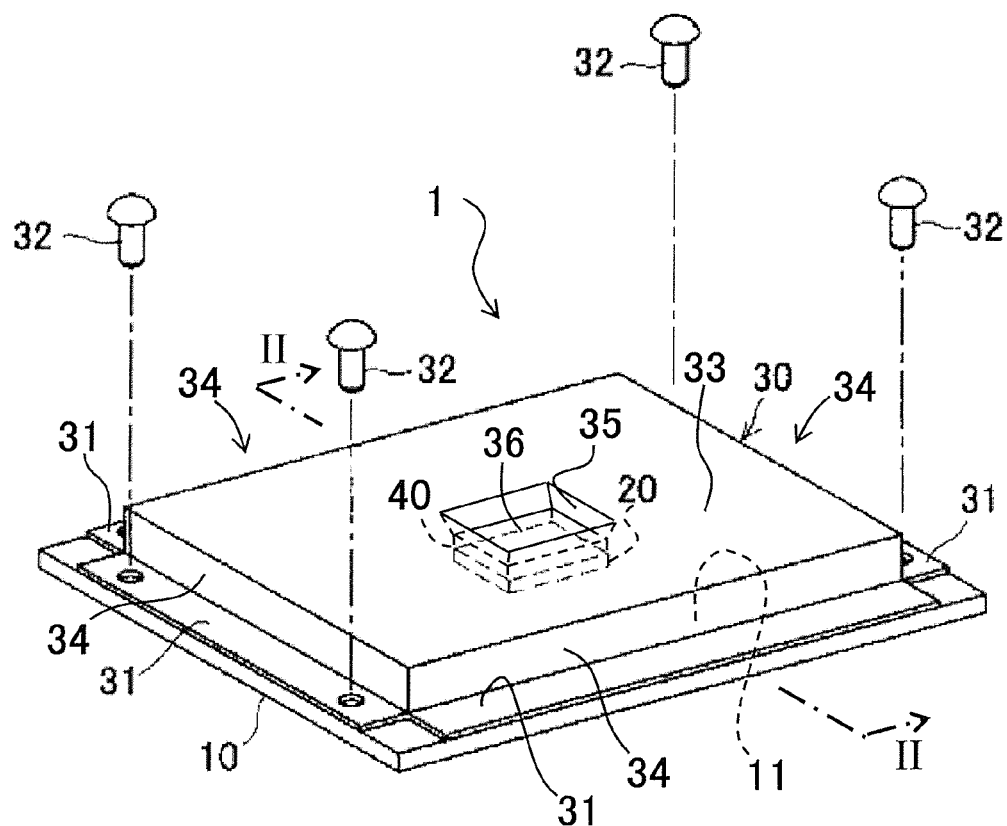
FIG. 1 is an exploded perspective view of a package substrate in accordance with a first embodiment.
Figure 2:
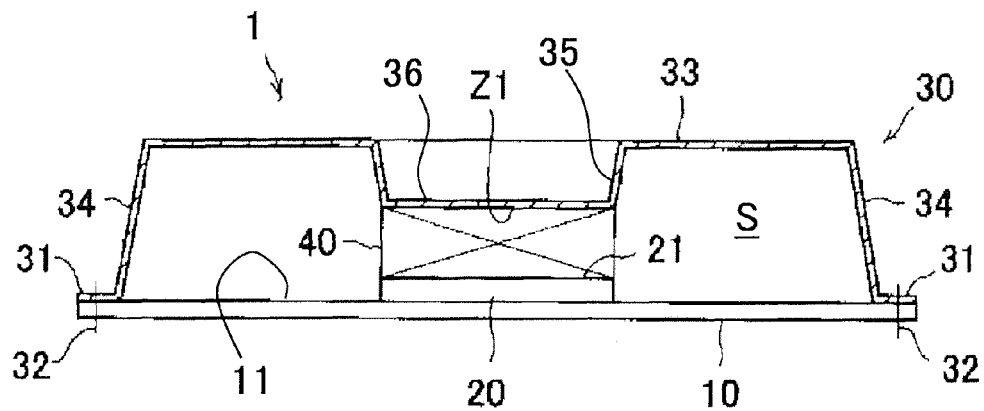
FIG. 2 is a cross sectional view of the package substrate taken along line II-II in FIG. 1.

A package substrate (e.g., sealed package substrate) 1 will now be described through reference to FIGS. 1 and 2. As illustrated in FIGS. 1 and 2, the package substrate 1 includes a circuit board 10, an electronic part (e.g., electronic component) 20, an electromagnetic shield cover 30 and a heat conducting member 40. The circuit board 10 has a rectangular shape. The circuit board 10 includes a printed circuit that is formed on the circuit board 10. The electronic part 20 includes an IC (Integrated Circuit) or other such electronic part. The electronic part 20 generates heat while the electronic part 20 is running. The electronic part 20 is mounted on the circuit board 10, and electrically connected to the circuit board 10. The electronic part 20 includes a flat outer surface (e.g., flat top surface) 21. The electromagnetic shield cover 30 is fixedly coupled to the circuit board 10, and covers an entire board surface 11 of the circuit board 10 to package the package substrate 1. The electromagnetic shield cover 30 houses the electronic part 20 within an inside space S defined between the electromagnetic shield cover 30 and the board surface 11 of the circuit board 10. The electromagnetic shield cover 30 is made of sheet metal. The electromagnetic shield cover 30 is integrally formed as a one-piece, unitary member. The electromagnetic shield cover 30 includes a plurality of (four in FIG. 1) attachment pieces 31, a flat roof (e.g., top plate) 33, a plurality of (four in FIG. 1) border pieces 34 and a protruding portion 35 with a bottom part 36. The border pieces 34 are contiguously located to the flat roof 33, and extend from four surrounding side portions of the flat roof 33. Each of the attachment pieces 31 is formed by bending an end portion of each of the border pieces 34. Two of the attachment pieces 31 have screw holes. The electromagnetic shield cover 30 is fixedly coupled to the circuit board 10 with a plurality of (four in FIG. 1) attachment screws 32. The attachment screws 32 are disposed through the screw holes of the attachment pieces 31. Attachment of the electromagnetic shield cover 30 to the circuit board 10 can also be accomplished by adhesive bonding, latching, or any other suitable means. The bottom part 36 of the protruding portion 35 is located opposite the outer surface 21 of the electronic part 20 at a vertically spaced apart location from the outer surface 21 of the electronic part 20. In other words, the bottom part 36 of the protruding portion 35 does not directly contact the outer surface 21 of the electronic part 20.

A specific vertical gap is ensured between the outer surface 21 of the electronic part 20 and the roof 33 of the electromagnetic shield cover 30. A specific horizontal gap is also ensured between the electronic part 20 and the border piece 34 of the electromagnetic shield cover 30. With this configuration, unnecessary radiation noise generated by the electronic part 20 is not transmitted directly to the electromagnetic shield cover 30. Thus, the electromagnetic shield cover 30 can adequately block the unnecessary radiation noise as required.

The electronic part 20 is mounted in an approximate center portion of the circuit board 10. The electronic part 20 generates heat when current passes through the electronic part 20. The electronic part 20 has a flattened shape having the flat outer surface 21. The heat conducting member 40 has high thermal conductivity. The heat conducting member 40 is vertically interposed between the flat outer surface 21 of the electronic part 20 and the roof 33 of the electromagnetic shield cover 30 within the inside space S. The heat conducting member 40 is placed directly over the entire flat outer surface 21 of the electronic part 20, and contacts both of a part (e.g., the bottom part 26) of the roof 33 of the electromagnetic shield cover 30 and the entire flat outer surface 21 of the electronic part 20. As a result, the heat conducting member 40 establishes a thermal connection between the electronic part 20 and the electromagnetic shield cover 30. With this configuration, heat generated from the electronic part 20 is transmitted by the heat conducting member 40 to the roof 33 of the electromagnetic shield cover 30, and is also transmitted from the roof 33 to the border piece 34. As a result, the entire electromagnetic shield cover 30 acts as a heat radiating plate.

The protruding portion 35 is formed on the roof 33 by drawing a center part of the roof 33 into a concave shape. The protruding portion 35 protrudes toward the electronic part 20 relative to the roof 33. The protruding portion 35 includes the bottom part 36 with a contact region Z1 between a board surface (e.g., the roof 33) of the electromagnetic shield cover 30 and the heat conducting member 40. The contact region Z1 is located closer to the outer surface 21 of the electronic part 20 than the roof 33. Since the contact region Z1 contacting the heat conducting member 40 is thus brought close to the outer surface 21 of the electronic part 20 by drawing into a concave shape, an advantage is that even if a tall electronic part is placed on the circuit board 10, interference between the tall electronic part and the roof 33 of the electromagnetic shield cover 30 can be avoided. Furthermore, this avoids a decrease in thermal conduction performance that would be caused by making the heat conducting member 40 too thick. The heat conducting member 40 is a rubber sheet material, such as a heat conducting sheet that exhibits thermal conductivity. In particular, the heat conducting member 40 is made of silicone rubber, such as TMS-L Series produced by Takeuchi Industry Co., Ltd. The heat conducting member 40 has lower electrical conductivity than the electromagnetic shield cover. Furthermore, the heat conducting member 40 has higher thermal conductivity than air within the inside space S.

With the package substrate 1, even if the electromagnetic shield cover 30 needs to be made taller, just part of the roof 33 of the electromagnetic shield cover 30 can be drawn into a concave shape and brought closer to the outer surface 21 of the electronic part 20. Thus, heat generated by the electronic part 20 can be transmitted to the electromagnetic shield cover 30 via the heat conducting member 40 without having to make the heat conducting member 40 all that thick. This is beneficial in terms of enhancing the heat dispersal effect of the electromagnetic shield cover 30 by making the heat conducting member 40 as thin as possible, and thereby raising the efficiency of heat conduction to the electromagnetic shield cover 30. Also, since the heat conducting member 40 is positioned merely by fitting the heat conducting member 40 that has been placed over the outer surface 21 of the electronic part 20 onto the concave portion formed by drawing of the electromagnetic shield cover 30. Thus, attachment of the heat conducting member 40 during the assembly becomes easier.

With the package substrate 1, heat generated by the electronic part 20 is conducted through the heat conducting member 40 to the electromagnetic shield cover 30 and is radiated from the entire board surface of the electromagnetic shield cover 30 so that less heat is generated from the electronic part 20. Furthermore, the heat conducting member 40 has lower electrical conductivity than the electromagnetic shield cover 30. Thus, compared to a situation in which the electromagnetic shield cover 30 is directly touching the outer surface 21 of the electronic part 20, interposing the heat conducting member 40 in the transmission pathway of the unnecessary radiation noise decrease the level of the unnecessary radiation noise being transmitted to the electromagnetic shield cover 30. In other words, a situation in which the unnecessary radiation noise blocking effect of the electromagnetic shield cover 30 is decreased does not occur. Therefore, it is possible to improve the heat dispersal effect by utilizing the electromagnetic shield cover 30 as a heat radiating plate, without sacrificing the unnecessary radiation noise blocking effect that is originally required of the electromagnetic shield cover 30. Also, the thickness of the package substrate 1 can be easily reduced. Thus, it can be used to advantage in cases when there is no space to provide a sheet metal member in an erect state as a conventional heat radiating plate on the circuit board 10. Furthermore, there is no need for a separate member serving as a conventional heat radiating plate, nor any need for space to provide such a member, or a heat radiating plate. As a result, manufacturing cost can be easily reduced.

Second Embodiment

Figure 3:
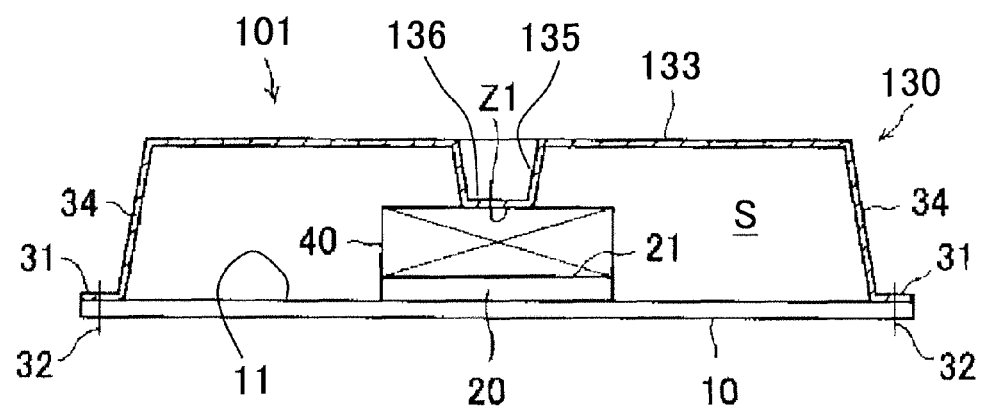
FIG. 3 is a cross sectional view of a package substrate in accordance with a second embodiment.

Referring now to FIG. 3, a package substrate 101 having a modified electromagnetic shield cover 130 in accordance with a second embodiment will now be explained. The electromagnetic shield cover 130 of this second embodiment is utilized in place of the electromagnetic shield cover 30 of the first embodiment.

In view of the similarity between the first and second embodiments, the parts of the second embodiment that are identical to the parts of the first embodiment will be given the same reference numerals as the parts of the first embodiment. Also, parts of this second embodiment that are functionally identical and/or substantially identical to parts of the first embodiment will be given the same reference numerals but with "100" added thereto. In any event, the descriptions of the parts of the second embodiment that are substantially identical to the parts of the first embodiment may be omitted for the sake of brevity. However, it will be apparent to those skilled in the art from this disclosure that the descriptions and illustrations of the first embodiment also apply to this second embodiment, except as discussed and/or illustrated herein.

FIG. 3 is a vertical cross sectional view of the package substrate 101 pertaining to a second embodiment. In this second embodiment, the electromagnetic shield cover 130 includes a roof 133 having a protruding portion 135 with a bottom part 136. The bottom part 136 directly contacts the heat conducting member 40. A contact region Z1 of the bottom part 136 contacting the heat conducting member 40 is made smaller than that in the first embodiment, which reduces a contact surface area between the heat conducting member 40 and the electromagnetic shield cover 130. With this package substrate 101, unnecessary radiation noise emitted from the electronic part 20 is only transmitted through a narrow contact area (e.g., contact region Z1) from the heat conducting member 40 to the roof 133 of the electromagnetic shield cover 130. The unnecessary radiation noise transmitted through the heat conducting member 40 to the electromagnetic shield cover 130 can be reduced in proportion to the contact surface area. As a result, the unnecessary radiation noise can be adequately blocked as required to the electromagnetic shield cover 130.

Third Embodiment

Figure 4:
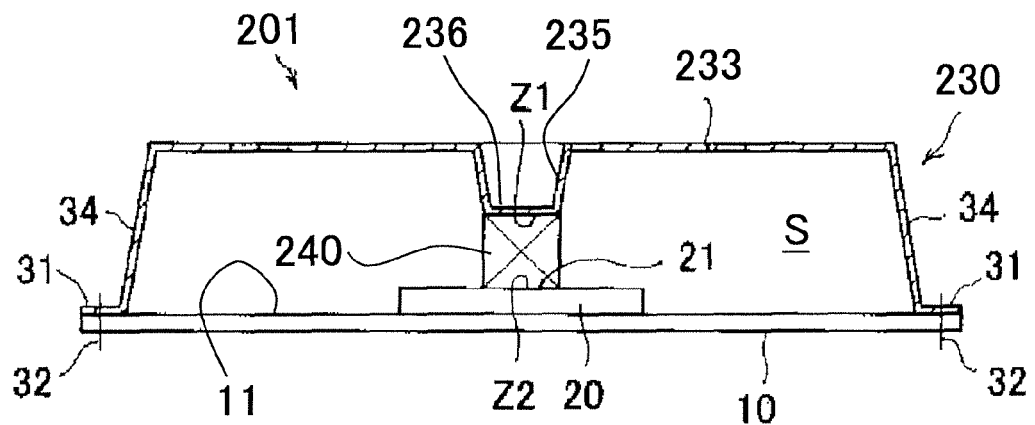
FIG. 4 is a cross sectional view of a package substrate in accordance with a third embodiment.

Referring now to FIG. 4, a package substrate 201 having a modified electromagnetic shield cover 230 and a modified heat conducting member 240 in accordance with a third embodiment will now be explained. The electromagnetic shield cover 230 of this third embodiment is utilized in place of the electromagnetic shield cover 30 of the first embodiment. The heat conducting member 240 of this third embodiment is utilized in place of the heat conducting member 40 of the first embodiments.

In view of the similarity between the first and third embodiments, the parts of the third embodiment that are identical to the parts of the first embodiment will be given the same reference numerals as the parts of the first embodiment. Also, parts of this third embodiment that are functionally identical and/or substantially identical to parts of the first embodiment will be given the same reference numerals but with "200" added thereto. In any event, the descriptions of the parts of the third embodiment that are substantially identical to the parts of the first embodiment may be omitted for the sake of brevity. However, it will be apparent to those skilled in the art from this disclosure that the descriptions and illustrations of the first embodiment also apply to this third embodiment, except as discussed and/or illustrated herein.

FIG. 4 is a vertical cross sectional view of the package substrate 201 pertaining to a third embodiment. The package substrate 201 includes the electromagnetic shield cover 230 and the heat conducting member 240. The electromagnetic shield cover 230 is identical to the electromagnetic shield cover 130 of the second embodiment. Thus, the descriptions of the electromagnetic shield cover 230 are omitted for the sake of brevity. The electromagnetic shield cover 230 includes a roof 233 having a protruding portion 235 with a bottom part 236. The bottom part 236 directly contacts the heat conducting member 240. Furthermore, in this third embodiment, the size of the heat conducting member 240 is reduced relative to the heat conducting member 40 of the first and second embodiments. As a result, a contact region Z1 of the bottom part 236 contacting the heat conducting member 240 is made smaller than that in the first embodiment. Furthermore, a contact region Z2 between the outer surface 21 of the electronic part 20 and the heat conducting member 240 is made smaller than that in the first and second embodiments. With this package substrate 201, unnecessary radiation noise emitted from the electronic part 20 is transmitted through the narrow contact region Z2 to the heat conducting member 240, and furthermore, is only transmitted through the narrow contact region Z1 to the roof 233 of the electromagnetic shield cover 230. The unnecessary radiation noise transmitted through the heat conducting member 240 to the electromagnetic shield cover 230 can be reduced in proportion to the contact regions Z1 and Z2. As a result, the unnecessary radiation noise can be adequately blocked as required to the electromagnetic shield cover 230.

With the flat electronic part 20 having the flat outer surface 21, heat is not generated uniformly from the entire outer surface 21. Thus, the extent to which the temperature rises varies with locations on the outer surface 21 of the electronic part 20. With the package substrate 201, the heat conducting member 240 contacts at least an area of the outer surface 21 having a highest temperature on the outer surface 21 while the electronic part 20 is running. In particular, the area of the outer surface 21 includes a highest temperature region that appears in an exothermic temperature distribution of the outer surface 21 of the electronic part 20. Thus, thermal conduction is carried out efficiently even though the heat conducting member 240 only partially contacts the outer surface 21 over a small contact surface area. Thus, heat generation by the electronic part 20 can be adequately suppressed. Further pore, the transmission of the unnecessary radiation noise through the heat conducting member 240 to the roof 233 of the electromagnetic shield cover 230 can be kept to a minimum.

With the package substrate 201, the smaller heat conducting member 240 contacts just a center portion including the highest temperature region that appears on the flat outer surface 21 of the IC or other such electronic part 20, not with the entire outer surface 21 of the electronic part 20. Therefore, the transmission of the unnecessary radiation noise through the heat conducting member 240 to the roof 233 of the electromagnetic shield cover 230 is suppressed and kept to a minimum, while allowing the heat dispersal performance of the electromagnetic shield cover 230 to be enhanced. In other words, not only is it possible to suppress the decrease in the unnecessary radiation noise blocking effect of the electromagnetic shield cover 230, but heat generated by the electronic part 20 is efficiently transmitted through the heat conducting member 240 to the electromagnetic shield cover 230, and heat dispersal can be promoted.

Fourth Embodiment

Figure 5:
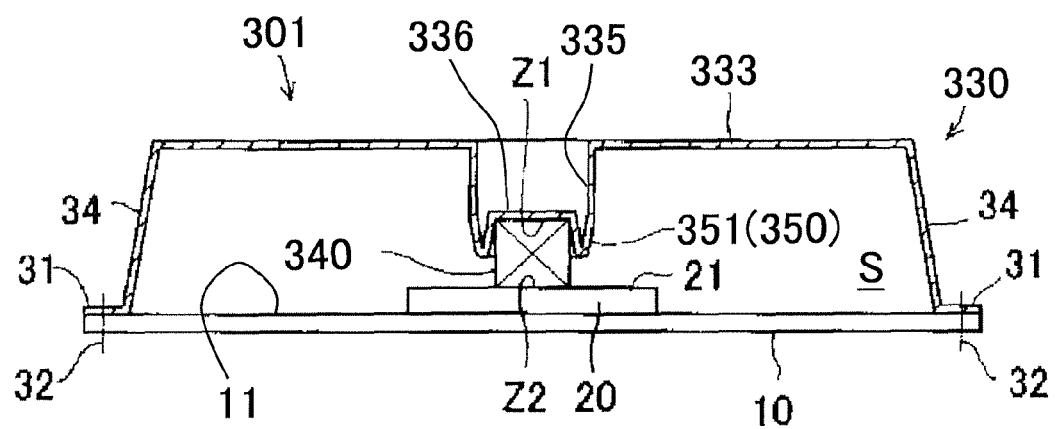
FIG. 5 is a cross sectional view of a package substrate in accordance with a fourth embodiment.

Referring now to FIG. 5, a package substrate 301 having a modified electromagnetic shield cover 330 and a modified heat conducting member 340 in accordance with a fourth embodiment will now be explained. The electromagnetic shield cover 330 of this fourth embodiment is utilized in place of the electromagnetic shield cover 30 of the first embodiment. The heat conducting member 340 of this fourth embodiment is utilized in place of the heat conducting member 40 of the first embodiments.

In view of the similarity between the first and fourth embodiments, the parts of the fourth embodiment that are identical to the parts of the first embodiment will be given the same reference numerals as the parts of the first embodiment. Also, parts of this fourth embodiment that are functionally identical and/or substantially identical to parts of the first embodiment will be given the same reference numerals but with "300" added thereto. In any event, the descriptions of the parts of the fourth embodiment that are substantially identical to the parts of the first embodiment may be omitted for the sake of brevity. However, it will be apparent to those skilled in the art from this disclosure that the descriptions and illustrations of the first embodiment also apply to this fourth embodiment, except as discussed and/or illustrated herein.

FIG. 5 is a vertical cross sectional view of the package substrate 301 pertaining to a fourth embodiment. The package substrate 301 includes the electromagnetic shield cover 330 and the heat conducting member 340. The electromagnetic shield cover 330 includes a roof 333 having a protruding portion 335 with a bottom part 336. The bottom part 336 directly contacts the heat conducting member 340. The heat conducting member 340 is identical to the heat conducting member 240 of the third embodiment. This fourth embodiment is similar to the third embodiment in that the size of the heat conducting member 340 is reduced relative to the heat conducting member 40 of the first embodiment, which reduces a contact region Z1 of the bottom part 336 contacting the heat conducting member 340. Furthermore, a contact region Z2 of the outer surface 21 of the electronic part 20 contacting the heat conducting member 340 is also reduced relative to that of the first embodiment. This fourth embodiment is also the same as the third embodiment in that the smaller heat conducting member 340 contacts only the center portion of the outer surface 21 which includes the highest temperature region on the flat outer surface 21 of the electronic part 20.

The electromagnetic shield cover 330 further includes a positioning portion (e.g., positioning means) 350 that is formed on the roof 333. The positioning portion prevents misalignment of the heat conducting member 340 in two axial directions (e.g., first and second directions) that are perpendicular to each other and go along the flat roof 333 of the electromagnetic shield cover 330. In other words, the positioning portion restricts movement of the heat conducting member 340 in the two axial directions. The positioning portion 350 includes a protrusion (e.g., a rib portion) 351. The protrusion 351 is formed around the bottom part 336 of the protruding portion 335 on the roof 33 of the electromagnetic shield cover 30. The protrusion 351 engages with an outer periphery (e.g., upper peripheral edge portion) of the heat conducting member 340 in the two axial directions. More specifically, part of the roof 333 is drawn into a concave shape that is rectangular in plan view, and a circumferential rib is formed around the bottom part 336 by folding back at the four side portions where the drawing is performed. The rib serves as the protrusion 351. With the positioning portion 350, there is no need to use a separate part as the positioning means for positioning the heat conducting member 340. Furthermore, since the protrusion 351 is in a state of being engaged with the four sides of the rectangular heat conducting sheet serving as the heat conducting member 340, misalignment of the heat conducting member 340 is effectively prevented. Therefore, the transmission of unnecessary radiation noise through the heat conducting member 340 to the roof 333 of the electromagnetic shield cover 330 can be kept to a minimum. Furthermore, it is less likely that the heat dispersal performance of the electromagnetic shield cover 330 will be lost due to vibration of the package substrate 301 or the like.

In particular, when the heat conducting sheet is employed as the heat conducting member 340, the contact regions Z1 and Z2 become smaller. Even though the size of the heat conducting sheet serving as the heat conducting member 340 is smaller, the heat conducting member 340 is taller for that size. Thus, the heat conducting member 340 tends to become misaligned due to vibration and so forth. However, with the positioning portion 350, the heat conducting member 340 can be prevented from coming out from between the outer surface 21 of the electronic part 20 and the roof 333 of the electromagnetic shield cover 330. Thus, it is prevented that no heat is transmitted to the electromagnetic shield cover 330, or that the heat conducting member 340 is shifted from the center portion that includes the highest temperature region of the outer surface 21 of the electronic part 20, which decreases thermal conduction efficiency.

Also, the positioning portion 350 is formed by the protrusion 351 that makes the bottom part 336 having a rectangular shape as mentioned above. Thus, the heat conducting member 340 can be positioned at the proper location on the outer surface 21 merely by fitting the heat conducting member 340, which is placed over the outer surface 21 of the electronic part 20, into the surrounding portion (e.g., the bottom part 336) of the rectangular protrusion 351 on the electromagnetic shield cover 330 side during assembling the package substrate 301, such as during attaching the electromagnetic shield cover 330 to the circuit board 10. Accordingly, the work of placing the heat conducting member 340 in the center portion including the highest temperature region of the outer surface 21 can be performed without any expertise being required.

With this package substrate 301, even when the heat conducting member 340 only contacts the high temperature region of the outer surface 21 of the electronic part 20, since misalignment of the heat conducting member 340 is prevented by the positioning portion 350 on the electromagnetic shield cover 330 side, the place where the heat conducting member 340 contacts the outer surface 21 of the electronic part 20 is accurately fixed. As a result, heat generated by the electronic part 20 is efficiently transmitted by the heat conducting member 340 to the electromagnetic shield cover 330, and there is less of a decrease in the heat dispersal effect of the electromagnetic shield cover 330.

Fifth Embodiment

Figure 6:
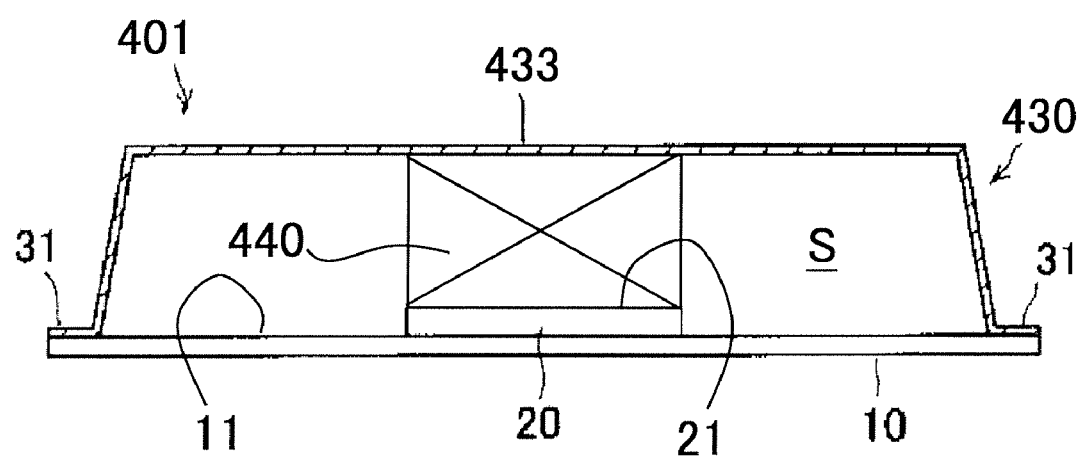
FIG. 6 is a cross sectional view of a package substrate in accordance with a fifth embodiment.

Referring now to FIG. 6, a package substrate 401 having a modified electromagnetic shield cover 430 and a modified heat conducting member 440 in accordance with a fifth embodiment will now be explained. The electromagnetic shield cover 430 of this fifth embodiment is utilized in place of the electromagnetic shield cover 30 of the first embodiment. The heat conducting member 440 of this fifth embodiment is utilized in place of the heat conducting member 40 of the first embodiments.

In view of the similarity between the first and fifth embodiments, the parts of the fifth embodiment that are identical to the parts of the first embodiment will be given the same reference numerals as the parts of the first embodiment. Also, parts of this fifth embodiment that are functionally identical and/or substantially identical to parts of the first embodiment will be given the same reference numerals but with "400" added thereto. In any event, the descriptions of the parts of the fifth embodiment that are substantially identical to the parts of the first embodiment may be omitted for the sake of brevity. However, it will be apparent to those skilled in the art from this disclosure that the descriptions and illustrations of the first embodiment also apply to this fifth embodiment, except as discussed and/or illustrated herein.

FIG. 6 is a vertical cross sectional view of the package substrate 401 pertaining to a fifth embodiment. In this fifth embodiment, the electromagnetic shield cover 430 includes a flat roof 433 without any concave portions. Furthermore, the package substrate 401 has the heat conducting member 440 that directly contacts both of the flat roof 433 and the outer surface 21 of the electronic part 20. The heat conducting member 440 establishes a thermal connection between the flat roof 433 of the electromagnetic shield cover 430 and the electronic part 20. Thus, heat generated from the electronic part 20 can be efficiently transferred to the electromagnetic shield cover 430 via the heat conducting member 440.

In the first to fifth embodiments, it is also possible to elastically press the roofs 33, 133, 233, 333, 433 of the electromagnetic shield covers 30, 130, 230, 330, 430 against the heat conducting members 40, 140, 240, 340, 440 that are placed over the outer surface 21 of the electronic part 20, respectively. With these configurations, the heat conducting members 40, 140, 240, 340, 440 are more securely affixed to the outer surface 21 of the electronic part 20 and the roofs 33, 133, 233, 333, 433 of the electromagnetic shield covers 30, 130, 230, 330, 430, respectively. Thus, heat generated from the electronic part 20 can be more efficiently transferred to the electromagnetic shield covers 30, 130, 230, 330, 430 via the heat conducting member 40, 140, 240, 340, 440, respectively.

General Interpretation of Terms

In understanding the scope of the present invention, the term "comprising" and its derivatives, as used herein, are intended to be open ended terms that specify the presence of the stated features, elements, components and groups, but do not exclude the presence of other unstated features, elements, components and groups. The foregoing also applies to words having similar meanings such as the terms, "including", "having" and their derivatives. Also, the terms "part," "section," "portion," "member" or "element" when used in the singular can have the dual meaning of a single part or a plurality of parts. As used herein to describe the present invention, the following directional terms "forward, rearward, above, downward, vertical, horizontal, below and transverse" as well as any other similar directional terms refer to those directions of a package substrate equipped with the present invention. Accordingly, these terms, as utilized to describe the present invention should be interpreted relative to a package substrate equipped with the present invention as used in the normal operating position.

While only selected embodiments have been chosen to illustrate the present invention, it will be apparent to those skilled in the art from these disclosures that various changes and modifications can be made herein without departing from the scope of the invention as defined in the appended claims. The functions of one element can be performed by two, and vice versa. Every feature which is unique from the prior art, alone or in combination with other features, also should be considered a separate description of further inventions by the applicant, including the structural and/or functional concepts embodied by such feature. Furthermore, the foregoing descriptions of the selected embodiments according to the present invention are provided for illustration only, and not for the purpose of limiting the invention as defined by the appended claims and their equivalents.

What is claimed is:

1. A package substrate comprising:
    a circuit board;
    an electronic component disposed on the circuit board;
    an electromagnetic shield cover fixedly coupled to the circuit board, the electromagnetic shield cover housing the electronic component within an inside space defined between the electromagnetic shield cover and the circuit board, the electromagnetic shield cover including a top plate and a protruding portion that is formed on the top plate, the protruding portion protruding toward the electronic component relative to the top plate, the top plate and the protruding portion being integrally formed as a one-piece, unitary member; and
    a heat conducting member disposed between the electronic component and the electromagnetic shield cover within the inside space, the heat conducting member contacting both of the electronic component and the electromagnetic shield cover such that the heat conducting member establishes a thermal connection between the electronic component and the electromagnetic shield cover, the heat conducting member contacting a bottom part of the protruding portion of the electromagnetic shield cover,
    the protruding portion of the electromagnetic shield cover defining a recess on the top plate of the electromagnetic shield cover, the recess defining an inner area that communicates with an outside space of the electromagnetic shield cover.

2. The package substrate according to claim 1, wherein the heat conducting member is configured to transmit heat from the electronic component to the electromagnetic shield cover while the electronic component is running.

3. The package substrate according to claim 1, wherein the electromagnetic shield cover further includes a positioning portion that is formed on the top plate, the positioning portion restricting movement of the heat conducting member in first and second directions on the top plate with the first and second directions being perpendicular to each other.

4. A package substrate comprising:
    a circuit board;
    an electronic component disposed on the circuit board;
    an electromagnetic shield cover fixedly coupled to the circuit board, the electromagnetic shield cover housing the electronic component within an inside space defined between the electromagnetic shield cover and the circuit board; and
    a heat conducting member disposed between the electronic component and the electromagnetic shield cover within the inside space, the heat conducting member contacting both of the electronic component and the electromagnetic shield cover such that the heat conducting member establishes a thermal connection between the electronic component and the electromagnetic shield cover, the electromagnetic shield cover including a top plate and a positioning portion that is formed on the top plate, the positioning portion restricting movement of the heat conducting member in first and second directions on the top plate with the first and second directions being perpendicular to each other, the positioning portion of the electromagnetic shield cover further having a rib portion that is formed on the top plate, the rib portion engaging with an upper peripheral edge portion of the heat conducting member in the first and second directions.

5. A package substrate comprising:

a circuit board;

an electronic component disposed on the circuit board;

an electromagnetic shield cover fixedly coupled to the circuit board, the electromagnetic shield cover housing the electronic component within an inside space defined between the electromagnetic shield cover and the circuit board; and a heat conducting member disposed between the electronic component and the electromagnetic shield cover within the inside space, the heat conducting member contacting both of the electronic component and the electromagnetic shield cover such that the heat conducting member establishes a thermal connection between the electronic component and the electromagnetic shield cover, the electromagnetic shield cover including a top plate and a protruding portion that is formed on the top plate, the protruding portion protruding toward the electronic component relative to the top plate, a bottom part of the protruding portion contacting the heat conducting member, the electromagnetic shield cover further including a positioning portion that is formed on the bottom part of the protruding portion, the positioning portion restricting movement of the heat conducting member in first and second directions on the top plate with the first and second directions being perpendicular to each other.

6. The package substrate according to claim 1, wherein the electromagnetic shield cover is integrally formed as a one-piece, unitary member.

7. The package substrate according to claim 1, wherein the electromagnetic shield cover is made of a sheet metal.

8. The package substrate according to claim 1, wherein the heat conducting member is made of a silicone rubber.

9. The package substrate according to claim 1, wherein the heat conducting member has lower electrical conductivity than the electromagnetic shield cover.

10. The package substrate according to claim 1, wherein the heat conducting member has higher thermal conductivity than air within the inside space.

11. The package substrate according to claim 5, wherein the electronic component includes an integrated circuit with a flat top surface, the heat conducting member contacting at least an area of the flat top surface having a highest temperature on the flat top surface while the integrated circuit is running.

12. The package substrate according to claim 5, wherein the heat conducting member is configured to transmit heat from the electronic component to the electromagnetic shield cover while the electronic component is running.

13. The package substrate according to claim 1, wherein the electronic component includes an integrated circuit with a flat top surface, the heat conducting member contacting at least an area of the flat top surface having a highest temperature on the flat top surface while the integrated circuit is running.

\* \* \* \* \*